United States Patent
Jee et al.

(10) Patent No.: US 9,295,164 B2
(45) Date of Patent: Mar. 22, 2016

(54) METHOD OF BONDING FLEXIBLE PRINTED CIRCUIT BOARD TO A DISPLAY PANEL

(71) Applicant: Samsung Display Co., Ltd., Yongin (KR)

(72) Inventors: An-Ho Jee, Yongin (KR); Seok-Hoon Yoon, Yongin (KR); Jong-Heon Han, Yongin (KR); Young-Hoon Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 14/016,933

(22) Filed: Sep. 3, 2013

(65) Prior Publication Data
US 2014/0332257 A1 Nov. 13, 2014

(30) Foreign Application Priority Data

May 9, 2013 (KR) .......................... 10-2013-0052749

(51) Int. Cl.
*H05K 3/20* (2006.01)
*H05K 3/32* (2006.01)
*H05K 1/18* (2006.01)

(52) U.S. Cl.
CPC ................ *H05K 3/323* (2013.01); *H05K 1/189* (2013.01); *H05K 3/326* (2013.01); *H05K 2201/09781* (2013.01); *H05K 2201/10128* (2013.01); *H05K 2203/166* (2013.01); *Y10T 156/10* (2015.01)

(58) Field of Classification Search
CPC ....... H05K 3/323; H05K 3/321; H05K 3/361; H05K 3/326; H05K 2201/09781; H05K 2203/166; H05K 1/189; H05K 2201/10128; Y10T 156/10; Y10T 29/49126; Y10T 29/49128; Y10T 29/49155
USPC ..... 29/829–831, 846; 174/84 R, 88 R, 117 A, 174/117 F; 156/273.9, 556, 581
See application file for complete search history.

(56) References Cited

U.S. PATENT DOCUMENTS

| | | | | |
|---|---|---|---|---|
| 4,731,503 A | * | 3/1988 | Kitanishi | H05K 3/361 174/117 A |
| 5,019,201 A | * | 5/1991 | Yabu | H05K 3/323 156/273.9 |
| 5,360,943 A | * | 11/1994 | Mori | H05K 3/323 174/117 FF |

(Continued)

FOREIGN PATENT DOCUMENTS

| | | |
|---|---|---|
| JP | 2002-072236 | 3/2002 |
| JP | 2009-147021 | 7/2009 |

(Continued)

*Primary Examiner* — Donghai D Nguyen
(74) *Attorney, Agent, or Firm* — H.C. Park & Associates, PLC

(57) ABSTRACT

A method of bonding a flexible printed circuit board (FPCB). The method includes disposing a bonding material on a connection unit of a panel, disposing a connection unit of the FPCB on the bonding material; disposing a thermally conductive sheet on the connection unit of the FPCB; and heating and pressing the connection unit of the FPCB onto the connection unit of the panel. The thermally conductive sheet includes through holes that are formed in the thermally conductive sheet or grooves that are formed in a bottom surface of the thermally conductive sheet. In the operation of heating and pressing the connection unit of the FPCB, extended portions of the FPCB are accepted into the through holes or the grooves in the thermally conductive sheet.

5 Claims, 5 Drawing Sheets

(56) References Cited

U.S. PATENT DOCUMENTS

| | | | |
|---|---|---|---|
| 6,623,577 B2 * | 9/2003 | Ogawa | H01L 21/67092 156/556 |
| 2012/0299888 A1 | 11/2012 | Kim et al. | |

FOREIGN PATENT DOCUMENTS

| | | |
|---|---|---|
| KR | 10-2009-0090762 | 8/2009 |
| KR | 10-2012-0131854 | 12/2012 |

* cited by examiner

METHOD OF BONDING FLEXIBLE PRINTED CIRCUIT BOARD TO A DISPLAY PANEL

CROSS-REFERENCE TO RELATED PATENT APPLICATION

This application claims from and the benefit of Korean Patent Application No. 10-2013-0052749, filed on May 9, 2013, which is hereby incorporated by reference for all purposes as if fully set forth herein.

BACKGROUND

1. Field

Exemplary embodiments of the present invention relate to a method of bonding a flexible printed circuit board (FPCB) and a display panel.

2. Discussion of the Background

Recently, a flat panel display has been widely used in conjunction with a liquid crystal display (LCD) or an organic light-emitting display.

A flat panel display generally has a display panel formed of a glass substrate, and a flexible printed circuit board (FPCB) may be connected to the flat panel display.

In order to bond the FPCB and the flat panel display including the glass substrate, an anisotropic conductive film (ACF) is interposed between the panel display and the FPCB, and then the FPCB is heated and pressed.

SUMMARY

Exemplary embodiments of the present invention provide a method of bonding a flexible printed circuit board (FPCB), whereby the number of bonding defects may be effectively decreased when a panel and the FPCB are bonded.

Exemplary embodiments of the present invention also provide a panel-FPCB assembly having an excellent bonding characteristic between a panel and an FPCB.

Additional features of the invention will be set forth in the description which follows, and in part will be apparent from the description, or may be learned by practice of the invention.

An exemplary embodiment of the present invention discloses a method of bonding a flexible printed circuit board (FPCB), the method including disposing a bonding material on a connection unit of a panel, wherein the connection unit is connected with the FPCB; disposing a connection unit of the FPCB on the bonding material; disposing a thermally conductive sheet on the connection unit of the FPCB; and heating and pressing the connection unit of the FPCB onto the connection unit of the panel by pressing the thermally conductive sheet. The thermally conductive sheet includes through holes that are formed in the thermally conductive sheet, or grooves that are formed in a bottom surface of the thermal conductive sheet. During the heating and pressing of the connection unit of the FPCB, the FPCB extends in a direction perpendicular to a press direction, and extended portions of the FPCB are accepted into the through holes or the grooves in the thermally conductive sheet.

An exemplary embodiment of the present invention also discloses a panel-flexible printed circuit board (FPCB) assembly including a panel, the panel including a connection unit and an FPCB including a connection unit that is bonded to the connection unit of the panel. The connection unit of the FPCB includes an electric connection area that is electrically connected with the panel and a non-electric connection area that is insulated from the panel. A projection that projects in a direction opposite to the panel is formed at the at least one non-electric connection area of the FPCB.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
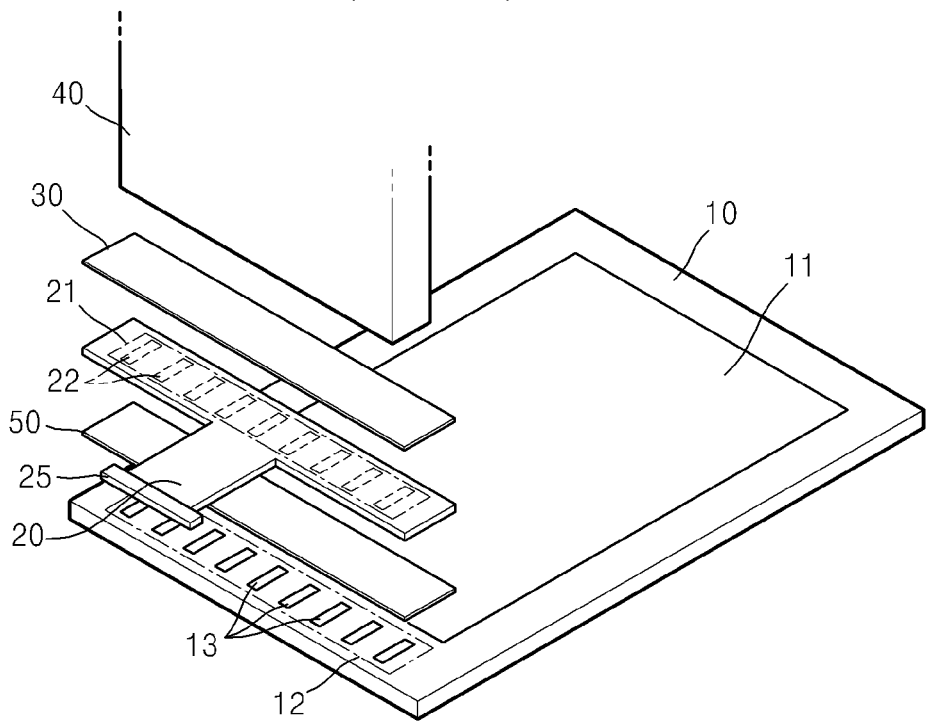
FIG. 1 is a perspective view illustrating a method of bonding a glass panel and a flexible printed circuit board (FPCB), according to the related art.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

It will be understood that when an element is referred to as being "on" or "connected to" another element, it can be directly on or directly connected to the other element, or intervening elements may be present. In contrast, when an element is referred to as being "directly on" or "directly connected to" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a perspective view illustrating a method of bonding a panel 10 and a flexible printed circuit board (FPCB) 20, according to the related art. The panel 10 shown in FIG. 1 may be a glass substrate panel for a flat display, such as a liquid crystal display (LCD), an organic light-emitting display, or the like, and hereinafter, is referred to as the glass panel 10. The glass panel 10 is formed with an image display unit 11 and a connection unit 12 for connection with an external circuit.

Referring to FIG. 1, the method of bonding the glass panel 10 and the FPCB 20 includes electrically connecting terminals 13 of the connection unit 12 of the glass panel 10 with terminals 22 of the connection unit 21 of the FPCB 20 and, in so doing, the method includes a process in which an anisotropic conductive film (ACF) 50 is interposed between the connection unit 12 of the glass panel 10 and the connection unit 21 of the FPCB 20, and then the FPCB 20 is heated and pressed at a high temperature.

In order to heat and press the FPCB 20 onto the glass panel 10, the FPCB 20 may be covered with a thermally conductive sheet 30, such as a sheet formed of Teflon™, and then may be pressed by a heating/pressing header 40, such as an FPCB-on-glass ("FOG") header 40. By using the thermally conductive sheet 30, heat and pressure of the FOG header 40 may be uniformly transferred to the FPCB 20 that is disposed below the thermally conductive sheet 30. When heat and pressure are applied to the connection unit 21 of the FPCB 20 by using the FOG header 40, the ACF 50 disposed below the FPCB 20 is hardened so that the connection unit 21 of the FPCB 20 and the connection unit 12 of the glass panel 10 are bonded to each other.

However, when the FPCB 20 has low heat resistance, a base film of the FPCB 20 may be thermally deformed such that the FPCB 20 may expand in a horizontal direction perpendicular to a pressing direction. The expansion of the FPCB 20 may cause misalignment between the terminals 13 of the glass panel 10 and the terminals 22 of the FPCB 20, and thus the glass panel 10 may operate abnormally. Also, the misalignment may decrease a contact area between the terminals 13 of the glass panel 10 and the terminals 22 of the FPCB 20 and, thus, the reliability of a product may also be reduced.

In order to prevent or at least reduce misalignment between the terminals 13 of the glass panel 10 and the terminals 22 of the FPCB 20 due to the expansion of the FPCB 20, an amount of extension of the FPCB 20 may be predicted, and then a given dimension of the connection unit 21 of the FPCB 20 may be designed to be less than a corresponding dimension of the connection unit 12 of the glass panel 10.

Figure 2:
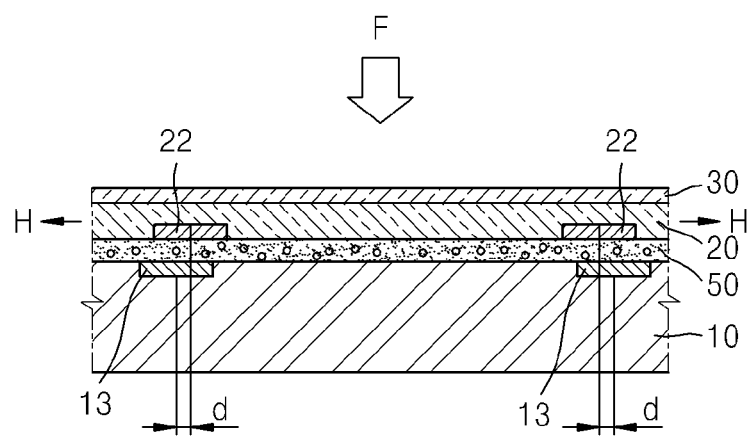
FIG. 2 is a cross-sectional view of a connection portion of the glass panel and the FPCB when the glass panel and the FPCB are heated and pressed by using the related art method of FIG. 1.

FIG. 2 is a cross-sectional view of a connection portion of the glass panel 10 and the FPCB 20, when the glass panel 10 and the FPCB 20 are heated and pressed. Referring to FIG. 2, the FPCB 20 is formed with a smaller dimension than a reference dimension, so as to prepare for the expansion that may occur in a heating and pressing process. Thus, a conductive pad that forms the terminal 22 of the FPCB 20 is inwardly disposed by a predicted amount of extension d, as compared to a conductive pad that forms the terminal 13 of the glass panel 10 that corresponds to the terminal 22 of the FPCB 20. When the thermally conductive sheet 30 is disposed on the FPCB 20, and then a pressing force F is applied to the thermally conductive sheet 30 using the FOG header 40, the FPCB 20 expands in a horizontal direction H perpendicular to a pressing direction. Thus, the terminal 22 of the FPCB 20 may move outwardly according to the expansion of the FPCB 20, so that the terminal 22 of the FPCB 20 may be positioned directly above the terminal 13 of the glass panel 10 which corresponds to the terminal 22 of the FPCB 20. Here, as the ACF 50 is hardened, the ACF 50 electrically connects the terminal 22 of the FPCB 20 with the corresponding terminal 13 of the glass panel 10, so that the FPCB 20 and the glass panel 10 are electrically connected.

However, the aforementioned method of designing the dimensions of the FPCB 20 by predicting the expansion of the FPCB 20 is limited with respect to accuracy, because the amount of extension varies according to the size of the FPCB 20, the alignment of the FPCB 20, a minor change in heating and pressing conditions, or the like. In particular, because a size of a display panel has increased, the size of the FPCB 20 has also increased, and in this regard, due to the increase in the size of the FPCB 20, the possibility and degree of misalignment due to the extension has also increased. Thus, it has become more important to decrease the possibility and degree of misalignment due to the extension of the FPCB 20.

Also, when a product undergoes a surface mounting process, the FPCB 20 is reduced in the surface mounting process and expands in a heating and pressing process, such that it is difficult to determine an extension rate of the connection unit 21 of the FPCB 20, and also to maintain the determined extension rate.

In order to solve the aforementioned problems, an exemplary embodiment of the present invention provides a method of bonding the FPCB 20. Hereinafter, the method of bonding the FPCB 20 is described, and in this regard, a glass display panel is used as a panel to which the FPCB 20 is connected.

Figure 3:
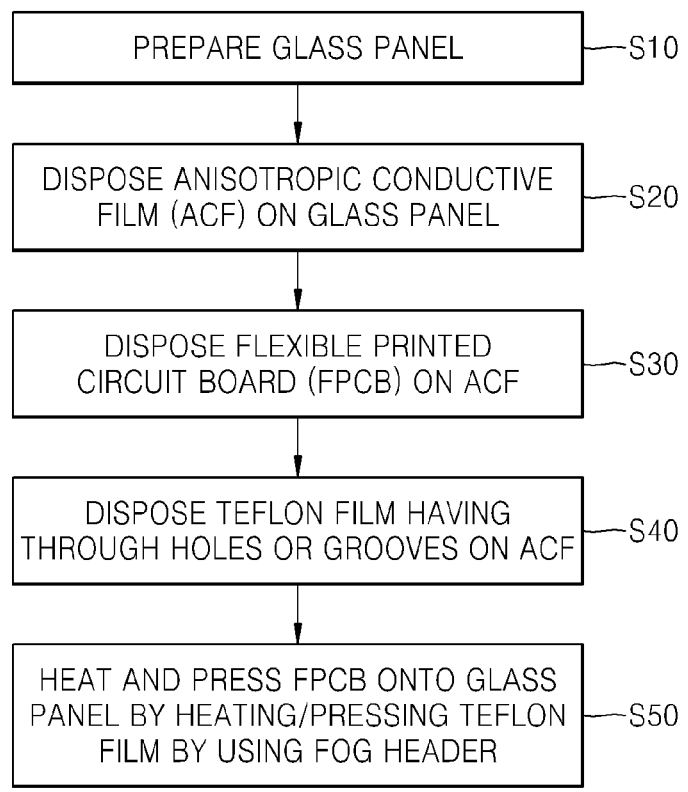
FIG. 3 is a flowchart of a method of bonding a glass panel and an FPCB according to an exemplary embodiment of the present invention.
Figure 4:
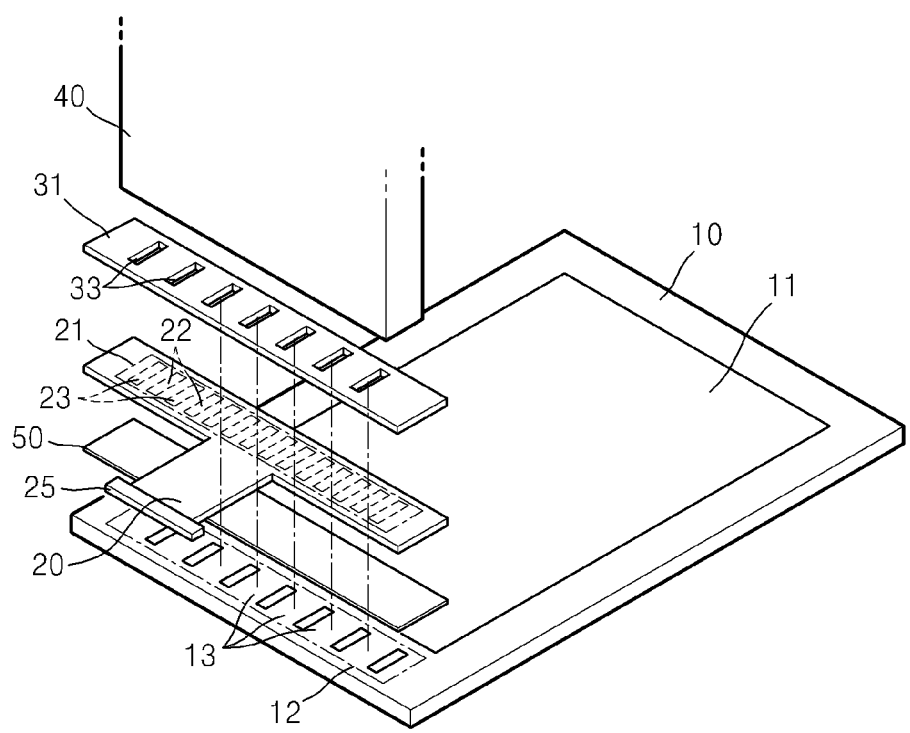
FIG. 4 is a perspective view illustrating the method of bonding the glass panel and the FPCB according to an exemplary embodiment of the present invention.

FIG. 3 is a flowchart of a method of bonding the FPCB 20, according to an exemplary embodiment of the present invention. FIG. 4 is a perspective view illustrating a process of bonding the FPCB 20.

Referring to FIGS. 3 and 4, the method of bonding the FPCB 20 involves preparing the glass panel 10 (operation S10), disposing the ACF 50 on the glass panel 10 (operation S20), disposing the FPCB 20 on the ACF 50 (operation S30), disposing a thermally conductive sheet 31 having through holes 33 on the FPCB 20 (operation S40), and heating and pressing the FPCB 20 onto the glass panel 10 using the FOG header 40 (operation S50).

In the preparing of the glass panel 10 (operation S10), the glass panel 10, including the image display unit 11 and the connection unit 21, is prepared.

In the disposing of the ACF 50 (operation S20), the ACF 50 is disposed on the connection unit 12 of the glass panel 10. The ACF 50 is formed by mixing minute conductive particles and an adhesive resin and then forming the mixture into a film. The ACF 50 is characterized in having electroconductivity only in one direction.

In disposing of the FPCB 20 on the ACF (operation S30), the connection unit 21 of the FPCB 20 is positioned on the ACF 50, so as to allow the terminals 22 of the connection unit 21 of the FPCB 20 to be positioned directly above the terminals 13 of the connection unit 12 of the glass panel 10. That is, in the present exemplary embodiment, without designing a process in which a given dimension of the FPCB 20 to be smaller than a reference dimension, based on expansion during a heating and pressing process, the terminals 22 of the FPCB 20 are aligned with the terminals 13 of the glass panel 10 before the heating and pressing process. Also, referring to FIGS. 5A and 5B, the FPCB 20 includes electrical connection areas A1 that have the terminals 22 for electrical connection with the glass panel 10, and non-electrical connection areas A2 that are positioned between the electric connection areas A1 and are insulated from the glass panel 10. A plurality of non-connection dummy pads 23 are not electrically connected with the glass panel 10 may be disposed between the electric connection areas A1 of the FPCB 20. The FPCB 20 may include an output terminal 25 for electrical connection with another external device other than the glass panel 10.

In the disposing of the thermally conductive sheet 31 having the through holes 33 (operation S40), the thermally conductive sheet 31 is prepared and then disposed on the FPCB 20. The through holes 33 may be formed at positions that correspond to the non-electric connection areas A2 between the FPCB 20 and the terminals 22, e.g., the through holes 33 may be formed at the positions that correspond to the non-connection dummy pads 23. The thermally conductive sheet 31 may be formed of a Teflon™ material having excellent thermal conductivity and heat resistance.

Figure 5A:
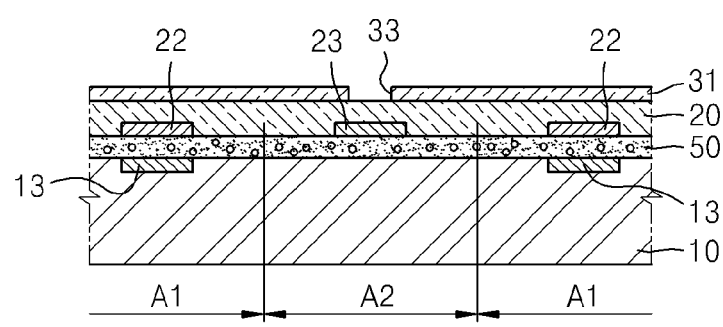
FIG. 5A and FIG. 5B are cross-sectional views of a connection portion of the FPCB and the glass panel when the method of bonding the glass panel and the FPCB is performed, as shown in FIG. 4.

FIG. 5A is a cross-sectional view of a connection portion of the FPCB 20 and the glass panel 10, wherein the glass panel 10, the ACF 50, the FPCB 20, and the thermally conductive sheet 31 are sequentially stacked in one direction. Referring to FIG. 5A, the terminals 22 of the FPCB 20 are positioned directly above the terminals 13 of the glass panel 10, and the through hole 33 of the thermally conductive sheet 31 is positioned to correspond to the non-electric connection area A2 between the electric connection areas A1 in which the terminals 22 of the FPCB 20 are positioned.

In the heating and pressing of the FPCB 20 (operation S50), the ACF 50 interposed between the FPCB 20 and the glass panel 10 is hardened by heating and pressing the thermally conductive sheet 31 using the FOG header 40, so that the FPCB 20 and the glass panel 10 are mechanically and electrically connected. In operation S50, the terminals 22 which are in the electric connection areas A1 of the FPCB 20 are electrically connected with the terminals 13 of the glass panel 10 via the ACF 50, and the non-electric connection areas A2 of the FPCB 20 remain electrically insulated from the connection unit 12 of the glass panel 10.

Figure 5B:
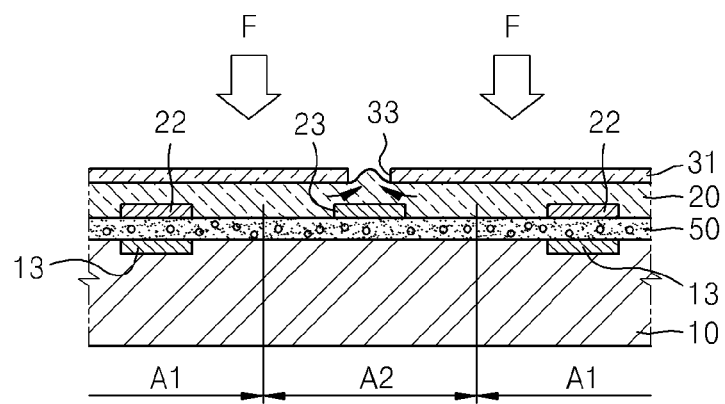

FIG. 5B is a cross-sectional view of a connection portion of the FPCB 20 and the glass panel 10, wherein the FPCB 20 is heated and pressed by the FOG header 40. Referring to FIG. 5B, once heat and pressure F are applied to the FPCB 20, the FPCB 20 horizontally extends and then the extended portion of the base material of FPCB 20 is inserted into the through hole 33 which is formed in the thermally conductive sheet 31. That is, the through hole 33 of the thermally conductive sheet 31 is used to cope with the expansion of the FPCB 20 that occurs when the FPCB 20 is pressed. As described above, the horizontal expansion of the FPCB 20 while the FPCB 20 is heated and pressed is accepted by the through hole 33 of the thermally conductive sheet 31, the horizontal movement of the FPCB 20 is significantly decreased in other portions of the FPCB 20, which exclude a portion around the through hole 33 of the thermally conductive sheet 31, i.e., the electric connection areas A1. Thus, although the FPCB 20 extends in a direction perpendicular to a pressing direction during the heating and pressing process, the electric connection areas A1 and the terminals 22 may maintain their original positions.

As described above, according to the method of bonding the FPCB 20, a position change around the electric connection areas A1 of the FPCB 20, i.e., around the terminals 22, may be efficiently decreased according to the horizontal expansion of the FPCB 20 which may occur when the FPCB 20 is heated and pressed. Thus, in a design of the FPCB 20, there is no need to seriously consider the extension of the FPCB 20 that occurs in the heating and pressing process. Therefore, it is possible to efficiently reduce problems, such as a connection error, the deterioration of product reliability, or the like, that are caused by the misalignment between the terminals 22 of the FPCB 20 and the terminals 13 of the glass panel 10.

The method of bonding the FPCB 20, according to the present exemplary embodiment, has been compared with the method of bonding the FPCB 20 by using the conventional thermally conductive sheet 30 in which through holes are not formed, by using an FPCB that is designed without consideration of an extension in dimensions. As a result of the comparison, the inventors of the present invention recognized that the method according to the present exemplary embodiment has a reduced degree of misalignment between terminals due to extension of the FPCB which is 10% to 20% of the degree of misalignment in the method performed by using the conventional thermally conductive sheet 30. Also, the inventors of the present invention recognized that the method according to the present exemplary embodiment is advantageous in reducing a deviation of the misalignment.

Figure 6:
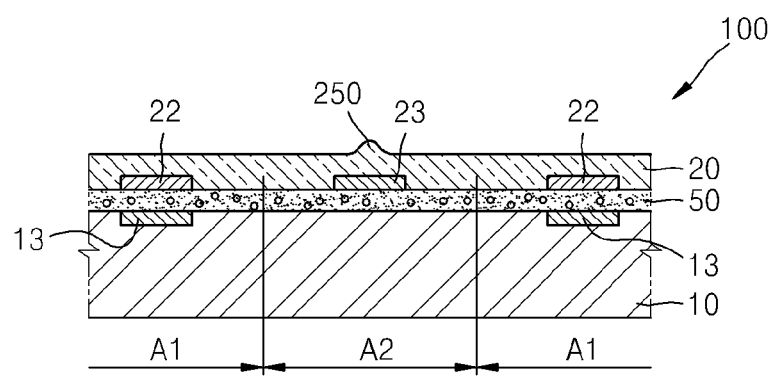
FIG. 6 is a cross-sectional view of a glass panel-FPCB assembly that is manufactured by using the aforementioned method, according to an exemplary embodiment of the present invention.

When the FPCB 20 and the glass panel 10 are bonded by the method according to the present exemplary embodiment, the thermally conductive sheet 31 may be removed, so that a glass panel-FPCB assembly may be manufactured. FIG. 6 is a cross-sectional view of a glass panel-FPCB assembly 100 which is manufactured by using the aforementioned method, according to an exemplary embodiment of the present invention. FIG. 6 illustrates a connection portion of the FPCB 20 and the glass panel 10. Referring to FIG. 6, when the glass panel-FPCB assembly 100 is manufactured by using the method according to the previously-described exemplary embodiment, an extended portion of the FPCB 20 which occurs in a process of pressing the FPCB 20 may be guided to the through hole 33 of the thermally conductive sheet 31, so that the extended portion may form a projection 250. That is, the glass panel-FPCB assembly 100 that is manufactured by using the method according to the previously-described exemplary embodiment includes the projection 250 in the non-electrical connection area A2 between the electric connection areas A1 of the FPCB 20.

The glass panel-FPCB assembly 100 may be used in the manufacture of a flat display and, as described above, the reliability of bonding between the FPCB 20 and the glass panel 10 is high such that the flat display, including the glass panel-FPCB assembly 100, may also have improved reliability.

Figure 7:
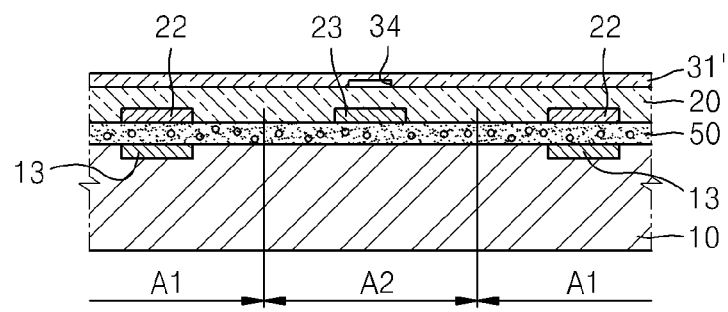
FIG. 7 is a cross-sectional view of a connection portion of the FPCB and the glass panel when a method of bonding the glass panel and the FPCB is performed, according to another exemplary embodiment of the present invention.

While it is described above that the thermally conductive sheet 31 has the through holes 33 at the positions that correspond to the non-electrical connection areas A2 of the FPCB 20, the thermally conductive sheet 31 may instead be formed with grooves formed at a bottom surface of the thermally conductive sheet 31 so as to accept the extended portion of the FPCB 20. FIG. 7 is a cross-sectional view of another exemplary embodiment in which a thermally conductive sheet 31' has grooves 34 at its bottom surface. Since the grooves 34 are formed in the bottom surface of the thermally conductive sheet 31', as illustrated in FIG. 7, an extended portion of the FPCB 20 may be accepted by the grooves 34, so that a bonding defect or reliability deterioration due to the extension of the FPCB 20 may be efficiently suppressed. Alternatively, the thermally conductive sheet 31' may have both through holes and grooves at its bottom.

Also, while it is described above that the through holes 33 of the thermally conductive sheet 31 are positioned between the terminals 22 of the FPCB 20, positions of the through holes 33 formed in the thermally conductive sheet 31 may be at outer areas of the terminals 22 of the FPCB 20, provided that the through holes 33 at the positions may accept the extended portion of the FPCB 20.

Also, while it is described above that the FPCB 20 has the non-connection dummy pads 23 between the terminals 22, the FPCB 20 may instead omit the non-connection dummy pads 23.

Also, while it is described above that the glass panel 10 for a display and the FPCB 20 are bonded, the method according to the exemplary embodiments of the present invention described above may also be applied to a case of bonding an FPCB with a panel or a substrate for another use.

Also, while it is described above that a Teflon™ material is used to form the thermally conductive sheet 31, the thermally conductive sheet 31 may be formed not only of the Teflon™ material but also may be formed of another material having excellent thermal conductivity and durability with respect to heat and pressure.

According to the method of bonding a glass panel and an FPCB of the exemplary embodiments of the present invention, a bonding defect between the glass panel and the FPCB may be effectively decreased. Thus, a glass panel-FPCB assembly manufactured by using the method has excellent reliability.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of bonding a flexible printed circuit board (FPCB), the method comprising:
    disposing a bonding material on a connection unit of a panel, the connection unit to be mechanically and electrically connected with the FPCB;
    disposing a connection unit of the FPCB on the bonding material;
    disposing a thermally conductive sheet on the connection unit of the FPCB; and
    heating and pressing the connection unit of the FPCB onto the connection unit of the panel by pressing the thermally conductive sheet in a first direction,
    wherein the thermally conductive sheet comprises through holes formed in the thermal conductive sheet or grooves formed in a bottom surface of the thermally conductive sheet, and
    wherein, in the heating and pressing of the connection unit of the FPCB, the FPCB extends in a direction perpendicular to a first direction such that extended portions of the FPCB are inserted into the through holes or the grooves in the thermally conductive sheet.

2. The method of claim 1, wherein the connection unit of the FPCB comprises:
    an electrical connection area comprising a terminal electrically connected with the panel; and
    a non-electrical connection area electrically insulated from the panel,
    wherein the thermally conductive sheet is positioned such that the through holes or the grooves are disposed to correspond to the non-electric connection area of the connection unit of the FPCB.

3. The method of claim 2, wherein a more than one of the electric connection areas and more than one of the non-electric connection areas are formed on the FPCB, and
    wherein the non-electric connection areas are positioned between the electric connection areas.

4. The method of claim 1, wherein the panel comprises a glass panel of a display unit, and
    wherein the bonding material comprises an anisotropic conductive film (ACF).

5. The method of claim 1, wherein the thermally conductive sheet comprises Teflon™.

* * * * *